(12) United States Patent
Downs (10) Patent No.: US 12,322,306 B2
(45) Date of Patent: Jun. 3, 2025

(54) RGBCA LED DISPLAY MODULES AND LED DISPLAY TILES AND LED VIDEO DISPLAYS HAVING THE SAME

(71) Applicant: ROE Visual US, Inc., Chatsworth, CA (US)

(72) Inventor: Tucker James Downs, Chatsworth, CA (US)

(73) Assignee: ROE Visual US, Inc., Chatsworth, CA (US)

( * ) Notice: Subject to any disclaimer, the term of this patent is extended or adjusted under 35 U.S.C. 154(b) by 0 days.

(21) Appl. No.: 18/945,902

(22) Filed: Nov. 13, 2024

(65) Prior Publication Data
US 2025/0157365 A1  May 15, 2025

Related U.S. Application Data

(60) Provisional application No. 63/599,330, filed on Nov. 15, 2023.

(51) Int. Cl.
*G09F 9/302* (2006.01)
*H01L 25/075* (2006.01)

(52) U.S. Cl.
CPC ........ *G09F 9/3026* (2013.01); *H01L 25/0753* (2013.01)

(58) Field of Classification Search
CPC ............................ G09F 9/3026; H01L 25/0753
See application file for complete search history.

(56) References Cited

U.S. PATENT DOCUMENTS 8,573,805 B2  11/2013  Leung et al.
9,172,012 B2 *  10/2015  Andrews ............. H01L 25/0753
(Continued)

FOREIGN PATENT DOCUMENTS

KR  10-2020-0114646 A  10/2020
WO  WO 2020065566 A1  4/2020
(Continued)

OTHER PUBLICATIONS

International Search Report and Written Opinion in PCT Application No. PCT/US2024/055684 dated Mar. 4, 2025, in 10 pages.

*Primary Examiner* — Vinh T Lam
(74) *Attorney, Agent, or Firm* — Knobbe, Martens, Olson & Bear LLP (57) ABSTRACT

An LED display module has red, green, blue, cyan, amber (RGBCA) LED packages spaced apart from each other in an array mounted on a single printed circuit board. Each RGBCA LED package is addressable individually and includes a red LED chip, a blue LED chip, a green LED chip, a cyan LED chip and an amber LED chip. The red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth. An LED display tile can include multiple LED display modules. An LED video display can include multiple LED display tiles coupled together to provide a seamless homogeneous video screen.

23 Claims, 9 Drawing Sheets

(56) References Cited

U.S. PATENT DOCUMENTS

| | | | |
|---|---|---|---|
| 9,970,628 B2* | 5/2018 | Zhang | F21V 5/04 |
| 11,355,481 B2* | 6/2022 | Alfier | H10H 29/142 |
| 12,029,073 B2* | 7/2024 | Shang | H10K 59/1216 |
| 2004/0218387 A1* | 11/2004 | Gerlach | F21K 9/00 |
| | | | 362/240 |
| 2006/0044215 A1 | 3/2006 | Brody et al. | |
| 2011/0133223 A1 | 6/2011 | van de Ven et al. | |
| 2013/0322070 A1* | 12/2013 | Clark | H10H 20/855 |
| | | | 362/249.02 |
| 2014/0118424 A1 | 5/2014 | Young | |
| 2019/0333434 A1 | 10/2019 | Chen | |
| 2023/0282786 A1* | 9/2023 | Favale, Jr. | H10H 20/857 |
| | | | 257/98 |
| 2024/0392948 A1* | 11/2024 | Van Bommel | F21S 10/023 |

FOREIGN PATENT DOCUMENTS

| | | |
|---|---|---|
| WO | WO 2024174398 A1 | 8/2024 |
| WO | WO 2024194072 A1 | 9/2024 |

\* cited by examiner

FIG. 9

RGBCA LED DISPLAY MODULES AND LED DISPLAY TILES AND LED VIDEO DISPLAYS HAVING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to light emitting diode (LED) display modules and more particularly to red, green, blue, cyan and amber (RGBCA) LED display modules, LED display tiles including the same, and a LED video display including such LED display tiles.

Description of the Related Art

Red, green, blue (RGB) LED displays are used for displaying video. However, in direct view two cameras may view colors on the LED displays differently based on differences in the cameras, known as observer metamerism or metameric failure of observer metamerism. Also, such LED displays can use a lot of power. Lastly, in large spaces where LED video displays contribute significantly to the lighting design, the color rendering from RGB displays is unnatural.

SUMMARY

Accordingly, there is a need for improved LED display modules, such as for video displays including the same, that are more power efficient, exhibit better observer metamerism, and provide more natural lighting.

In some aspects, the techniques described herein relate to a light emitting diode (LED) display module (LDM), including: a plurality of red, green, blue, cyan, amber (RGBCA) light emitting diode (LED) packages spaced apart from each other in an array of between 100×100 and 250×250 and mounted on a single printed circuit board; and electronics adapted to operate the plurality of RGBCA LED packages, wherein each RGBCA LED package is a pixel that is addressable individually by the electronics, each RGBCA LED package including a red LED, a blue LED, a green LED, a cyan LED and an amber LED, wherein the red LED, the blue LED and the green LED operate at a narrow bandwidth, and the cyan LED and amber LED operate at a wide bandwidth, the cyan LED bandwidth being between the blue LED bandwidth and the green LED bandwidth, and the amber LED bandwidth being between the red LED bandwidth and the green LED bandwidth.

In some aspects, the techniques described herein relate to a light emitting diode (LED) display tile (also known as LED display cabinet or LED wall tile), including: a plurality of LED display modules (LDMs), each LED display module (LDM) including: a plurality of red, green, blue, cyan, amber (RGBCA) light emitting diode (LED) packages spaced apart from each other in an array of between 100×100 and 250×250 and mounted on a single printed circuit board, each RGBCA LED package being a pixel that is addressable individually, each RGBCA LED package including a red LED, a blue LED, a green LED, a cyan LED and an amber LED, wherein the red LED, the blue LED and the green LED operate at a narrow bandwidth, and the cyan LED and amber LED operate at a wide bandwidth, the cyan LED bandwidth being between the blue LED bandwidth and the green LED bandwidth, and the amber LED bandwidth being between the red LED bandwidth and the green LED bandwidth; a frame housing the plurality of LED modules, the frame being coupleable to one or more other frames, each housing a plurality of LED modules to define a continuous display; and electronics adapted to operate the plurality of RGBCA LED packages of the plurality of LED modules housed in the frame.

In some aspects, the techniques described herein relate to a light emitting diode (LED) video display, including: a plurality of LED display tiles coupled together side by side or top to bottom to define a continuous display, each of the plurality of LED display tiles including a plurality of LED display modules, each LED display module including: a plurality of red, green, blue, cyan, amber (RGBCA) light emitting diode (LED) packages spaced apart from each other in an array of between 100×100 and 250×250 and mounted on a single printed circuit board, each RGBCA LED package being a pixel that is addressable individually, each RGBCA LED package including a red LED, a blue LED, a green LED, a cyan LED and an amber LED, wherein the red LED, the blue LED and the green LED operate at a narrow bandwidth, and the cyan LED and amber LED operate at a wide bandwidth, the cyan LED bandwidth being between the blue LED bandwidth and the green LED bandwidth, and the amber LED bandwidth being between the red LED bandwidth and the green LED bandwidth; a frame housing the plurality of LED modules, the frame being coupleable to one or more other frames, each housing a plurality of LED modules to define a continuous display; and electronics adapted to operate the plurality of RGBCA LED packages of the plurality of LED modules housed in the frame.

DETAILED DESCRIPTION

Figure 1:
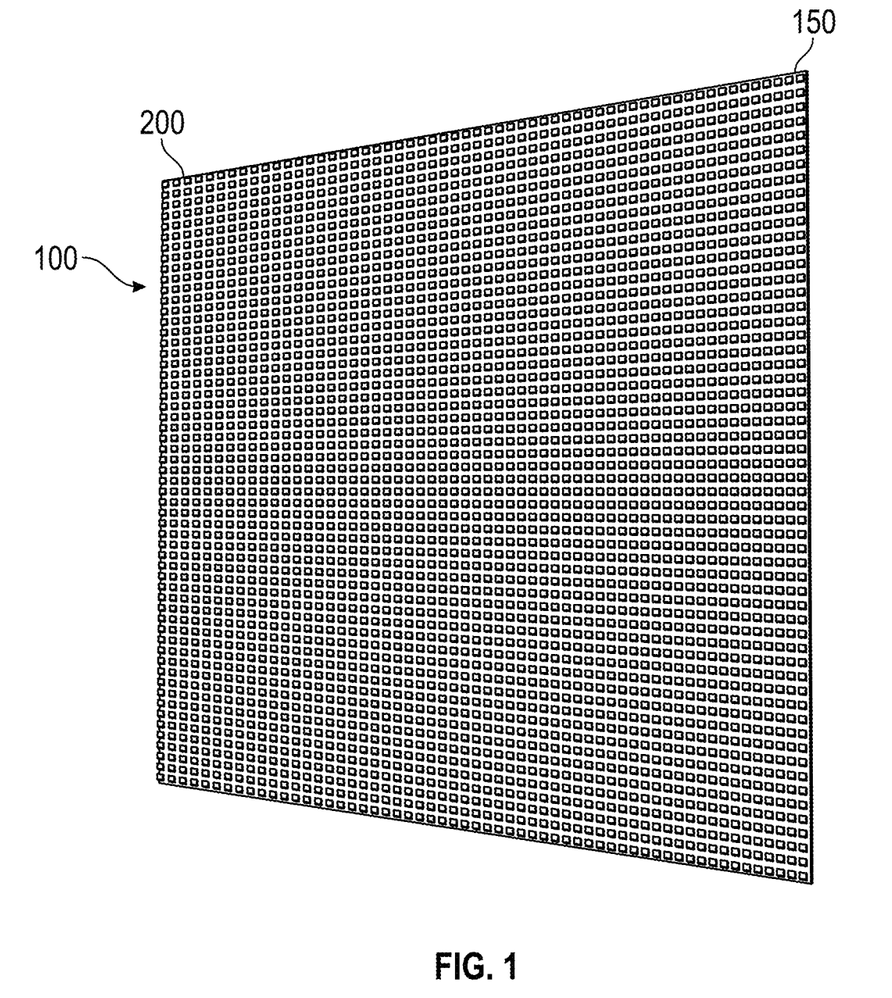
FIG. 1 is a perspective front side view of an RGBCA LED display module that can fit in a single tile frame.

FIG. 1 shows a front view of an RGBCA LED display module (LDM) 100 with a plurality of RGBCA LED packages 200 mounted on a single printed circuit board 150 (e.g., with surface mount technology). In one example, the RGBCA LED display module 100 can have a square shape. In another example, the RGBCA LED display module 100 can have a rectangular shape. Each RGBCA LED package 200 can be a pixel. The plurality of RGBCA LED packages 200 can be disposed in an array on the printed circuit board 150. The array can be between 100×100 and 250×250 RGBCA LED packages 200, in one example 116×116 RGBCA LED packages 200. The array can have a pitch of between 1 mm and 8 mm between RGBCA LED packages 200.

Figure 1A:
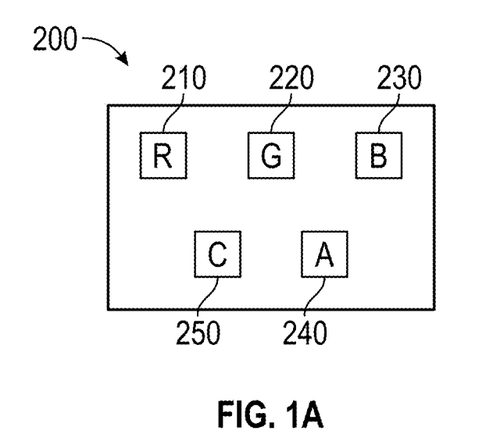
FIG. 1A is a schematic view of an RGBCA LED Package.
Figure 2:
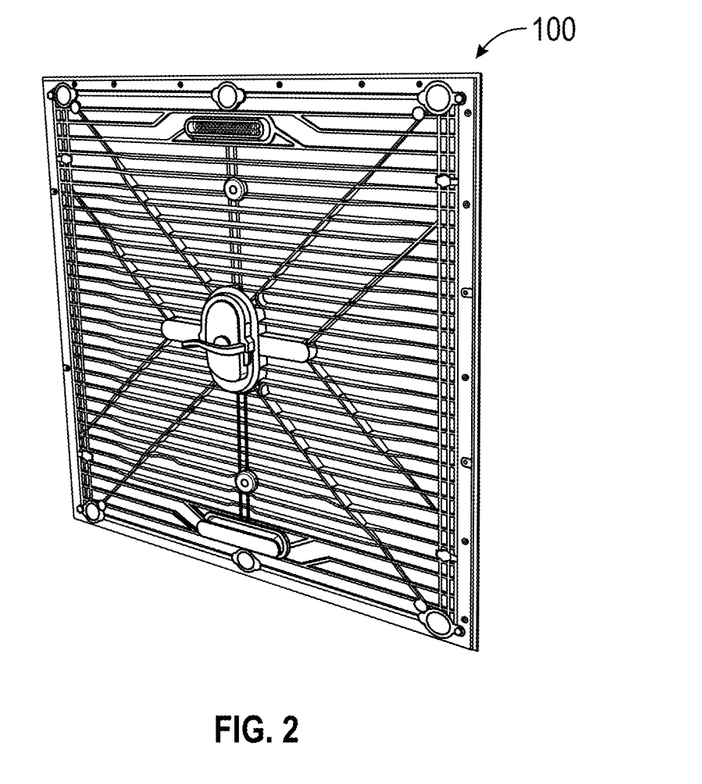
FIG. 2 is a perspective rear view of an RGBCA LED display module that can fit in a single tile frame.

FIG. 1A schematically shows an RGBCA LED package 200 (or pixel) that includes a red LED chip 210 (red subpixel), a green LED chip 220 (green subpixel), a blue LED chip 230 (blue subpixel), a cyan LED chip 240 (cyan subpixel) and an amber LED chip 250 (amber subpixel). FIG. 2 shows a rear view of the RGBCA LED display module 100. The red LED chip 210 can have a dominant wavelength (or hue) of 610 nm to 630 nm and an excitation purity of at least 90%. The green LED chip 220 can have a dominant wavelength (or hue) of 510 nm to 540 nm and an excitation purity of at least 80%. The blue LED chip 230 can have a dominant wavelength (or hue) of 460 nm to 475 nm and an excitation purity of at least 60%. The cyan LED chip 240 can have a dominant wavelength (or hue) of 480 nm to 510 nm and an excitation purity of 60-90%. The amber LED chip 250 can have a dominant wavelength (or hue) of 560 nm to 590 nm and an excitation purity of 60-90%. One of skill in the art will recognize that excitation purity is a measure of bandwidth. The cyan LED chip 240 and the amber LED chip 250 produce color by using an energizing LED and fluorescent color conversion material such as an LED phosphor or Quantum dot. The red subpixel, green subpixel and blue subpixel being primary subpixels, and the cyan subpixel and amber subpixel being secondary subpixels.

Figure 1B:
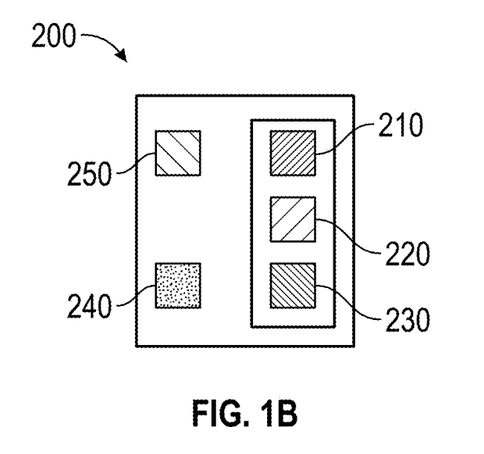
FIG. 1B is a schematic view of an RGBCA LED Package.

FIG. 1B schematically shows an RGBCA LED package 200 (or pixel) that includes a red LED chip 210, green LED chip 220 and blue LED chip 230 together and aligned, and an amber LED chip 240 and a cyan LED chip 250 aligned and parallel to the red LED chip 210, green LED chip 220 and blue LED chip 230.

FIG. 2 shows a rear of a LED display module, with the printed circuit board and electronics inside.

Figure 3:
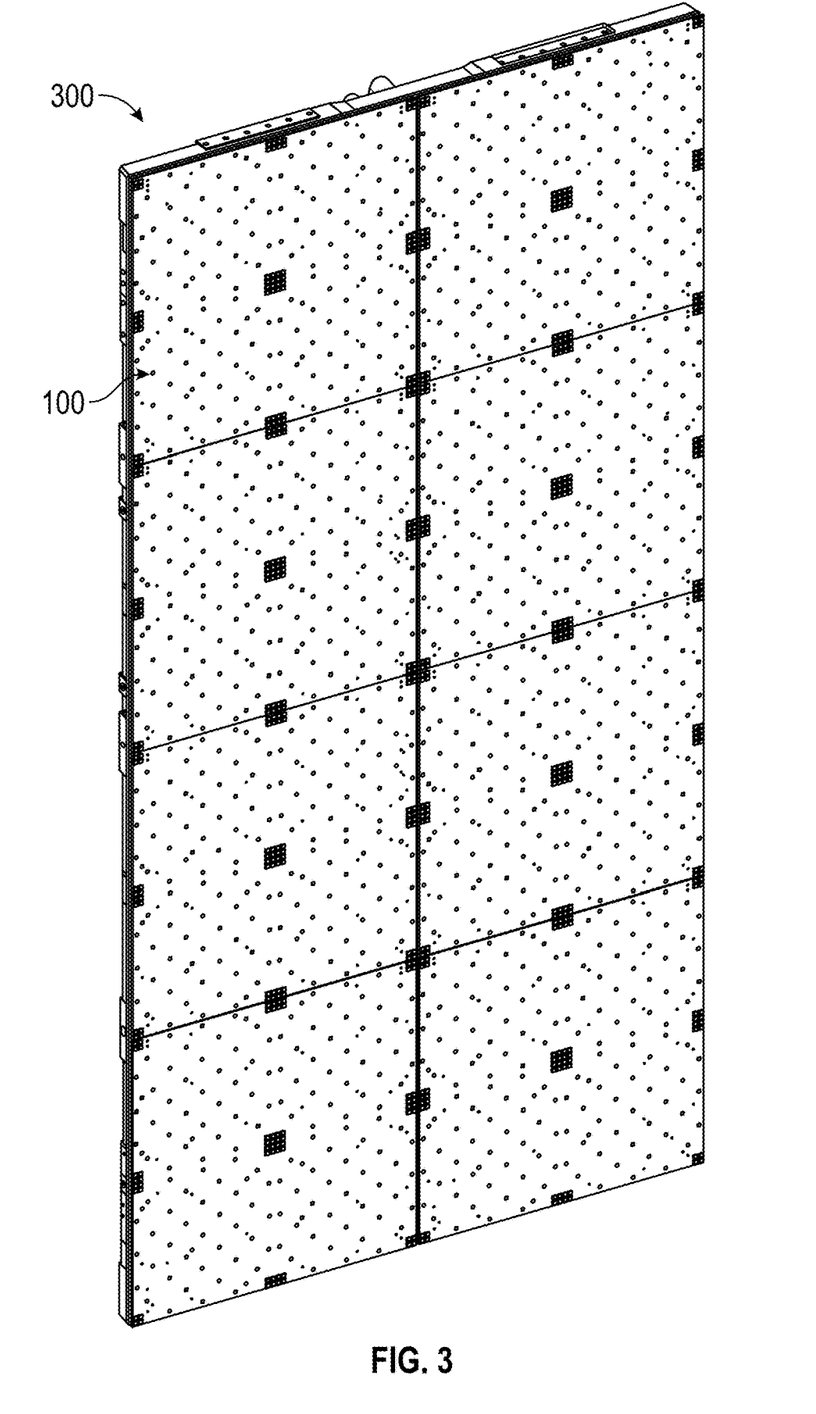
FIG. 3 is a front perspective view of a frame of a single LED display tile with eight RGBCA LED display modules.
Figure 4:
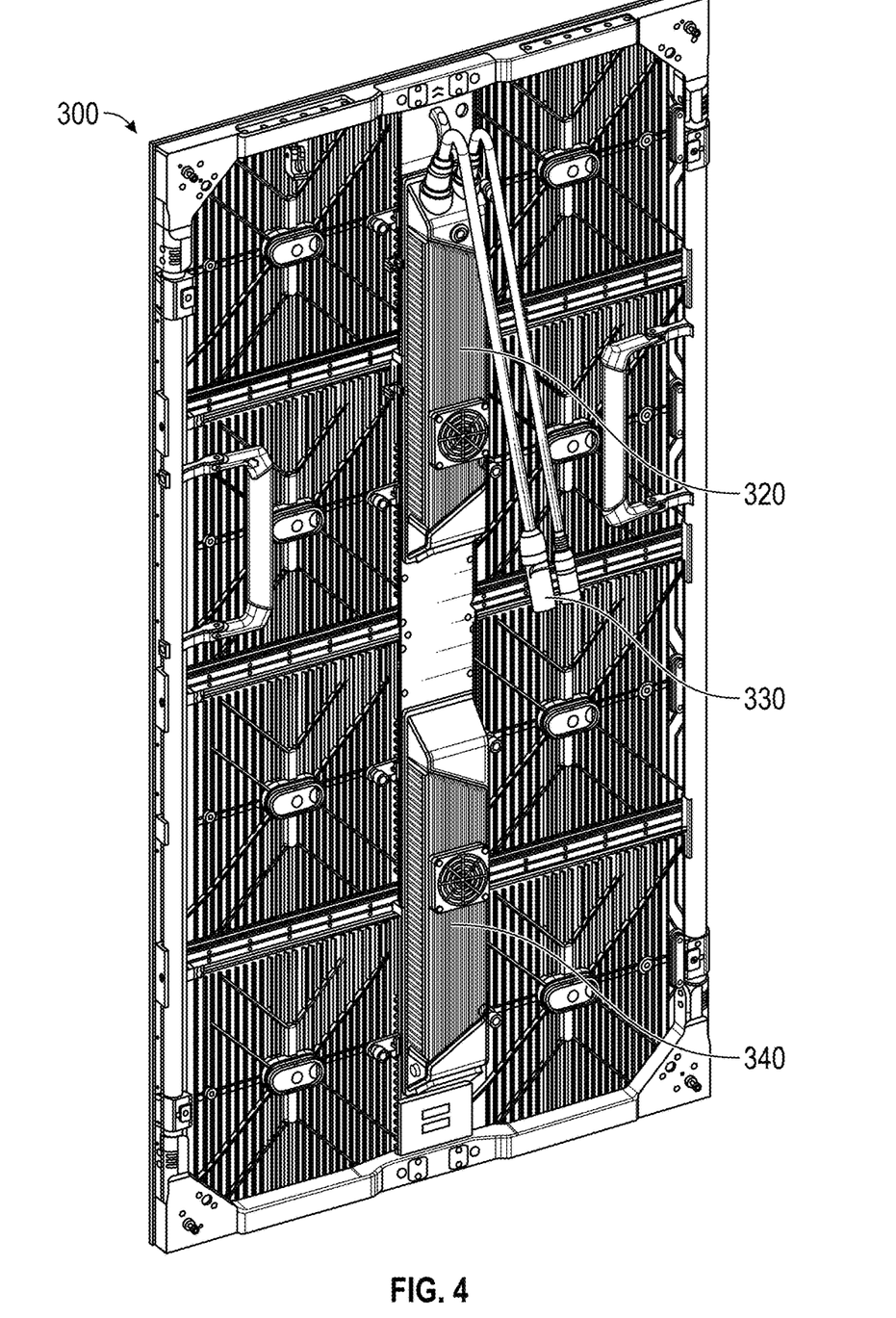
FIG. 4 is a rear perspective view of the frame in FIG. 3.

FIGS. 3-4 shows a frame 300 that houses (e.g., supports, encloses) a plurality of RGBCA LED display modules 100, the frame 300 and RGBCA LED display modules 100 together defining an LED display tile (or LED display cabinet or LED wall tile), with control electronics and power software on the frame 300. In FIG. 3, the frame 300 houses eight RGBCA LED display modules 100. However, the frame 300 can be sized to house fewer or more LED display modules (e.g., between two and twelve, such as four or eight). With reference to FIG. 4, the frame 300 can include electronics (e.g., circuitry) 320, cables 330, and power source 340. The corners of the LED display tile allow multiple tiles to be coupled or "stitched" together. In other examples, the mechanical connection between LED display tiles may be accomplished by top/bottom and side connecting points or clamps, rather than at the corners.

The cables 330 provide power (e.g., AC power 110V-240V) and data connection between the LED display tiles. The data connection is required to receive the control signal. In FIG. 4, the cables 330 are integrated cables. In other examples, the cables are not integrated into the frame 300. Rather the frame 300 can have data and power connectors to which cables can be removably coupled.

Figure 5:
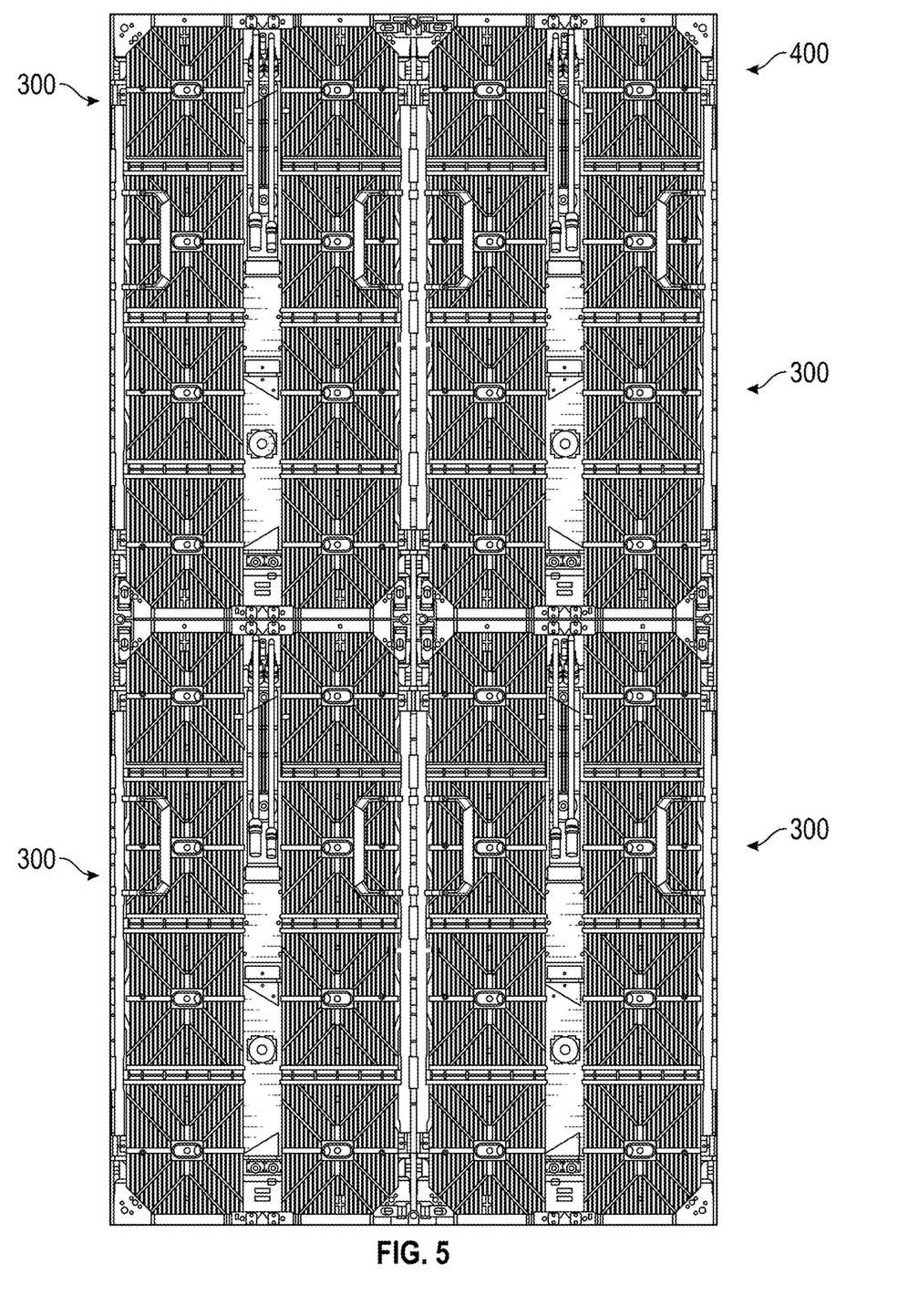
FIG. 5 is a rear planar view of a LED video display with four of the frames in FIG. 4.
Figure 6:
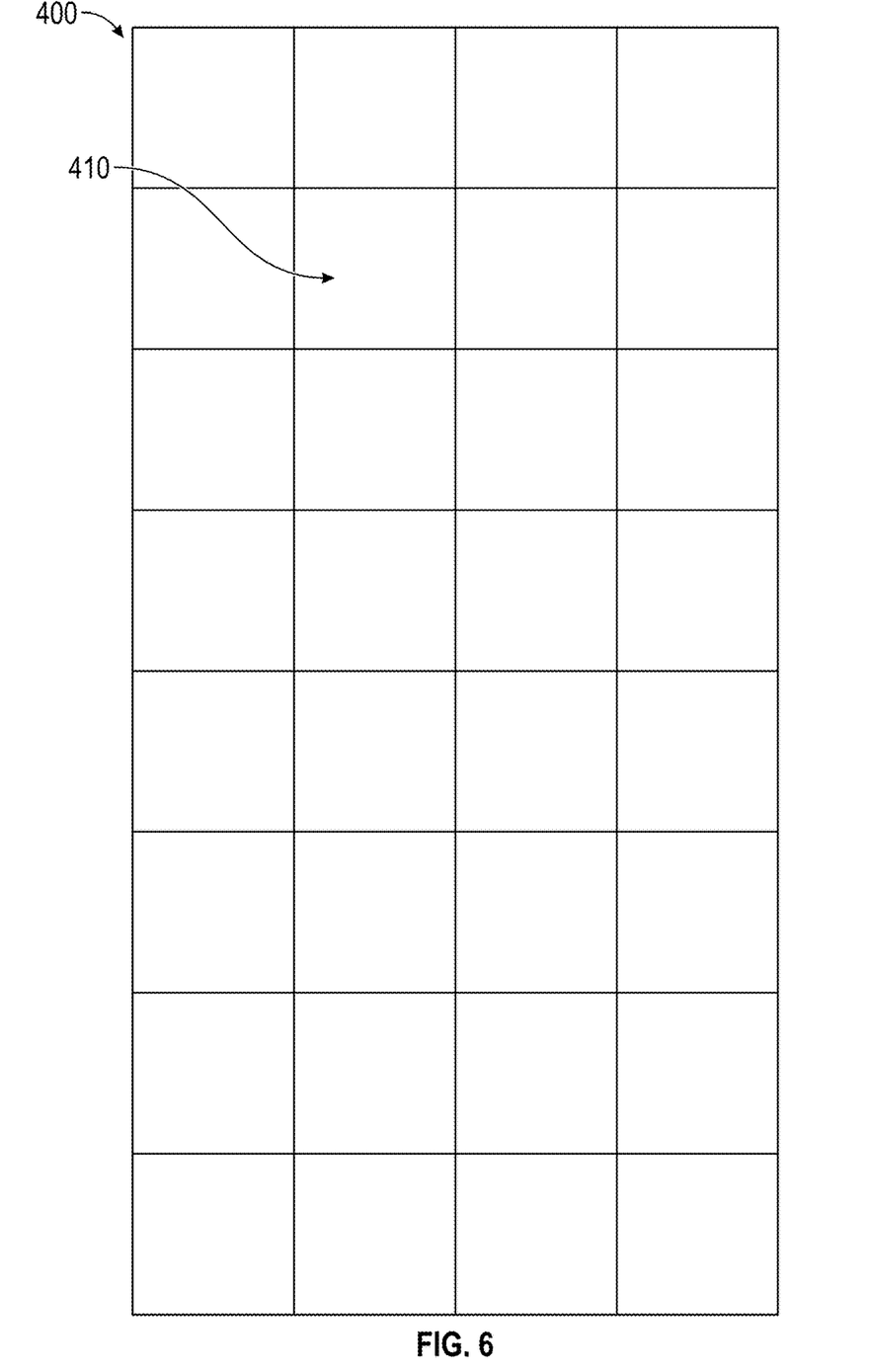
FIG. 6 is a schematic front planar view of the LED video display in FIG. 5.
Figure 7:
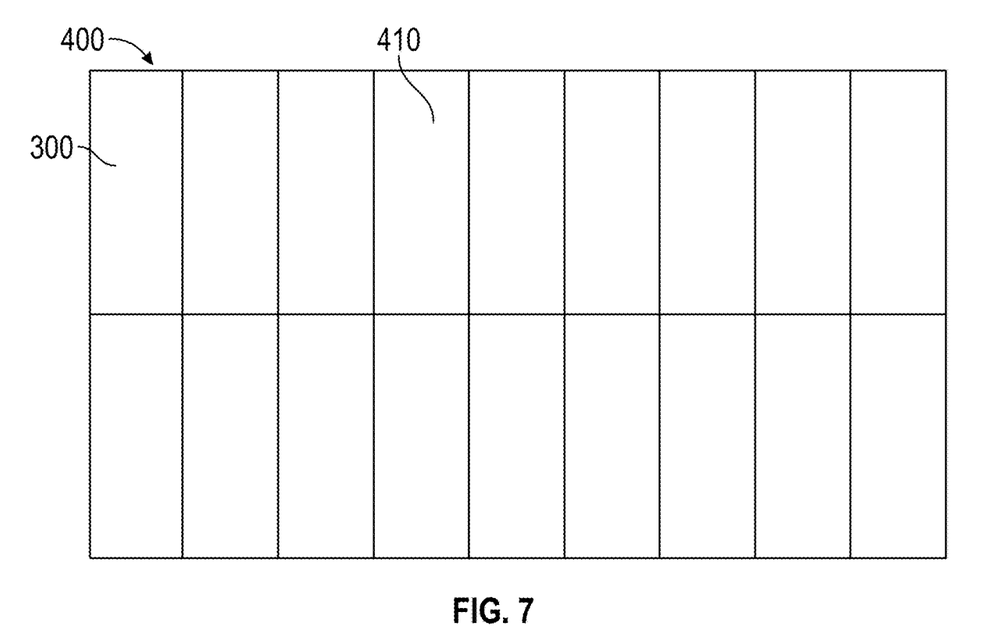
FIG. 7 is a schematic front view of an LED video display including multiple LED display tiles.

FIG. 5 shows a rear view of multiple frames 300 or LED display tiles (e.g., 100 LED display tiles, 200 LED display tiles, etc.) attached together to form a light emitting diode (LED) video display 400 (e.g., a high resolution display). FIG. 5 shows four frames 300 or LED display tiles that define the LED video display 400. However, more than four frames 300 or LED display tiles can form the LED video display 400. The frames 300 or LED display tiles can be adjacent each other (side to side and/or top to bottom) and releasably coupled to each other (e.g., via clamps) to provide a continuous LED video display 400 (e.g., with a seamless or homogeneous screen 410, shown in FIG. 6). FIG. 6 shows a front view of the LED video display 400 with the grid pattern meant to show the boundary of the separate RGBCA LED display modules 100 in the LED video display 400 (but the boundary would not be visible in practice, as the screen 410 would look seamless or homogenous). FIG. 7 shows another LED video display 400 defined by two rows of nine LED display tiles or frames 300; however, the LED video display 400 could have more (e.g., 100, 200, 300) or fewer (e.g., 15, 10) LED display tiles. In one example, the LED video display 400 can be about 100 feet wide. However, the LED video display 400 can have other suitable sizes. As with FIG. 6, the LED video display 400 in FIG. 7 shows boundaries of the separate LED display tiles that make up the display (but the boundary would not be visible in practice, as the screen 410 would look seamless or homogenous).

Figure 8:
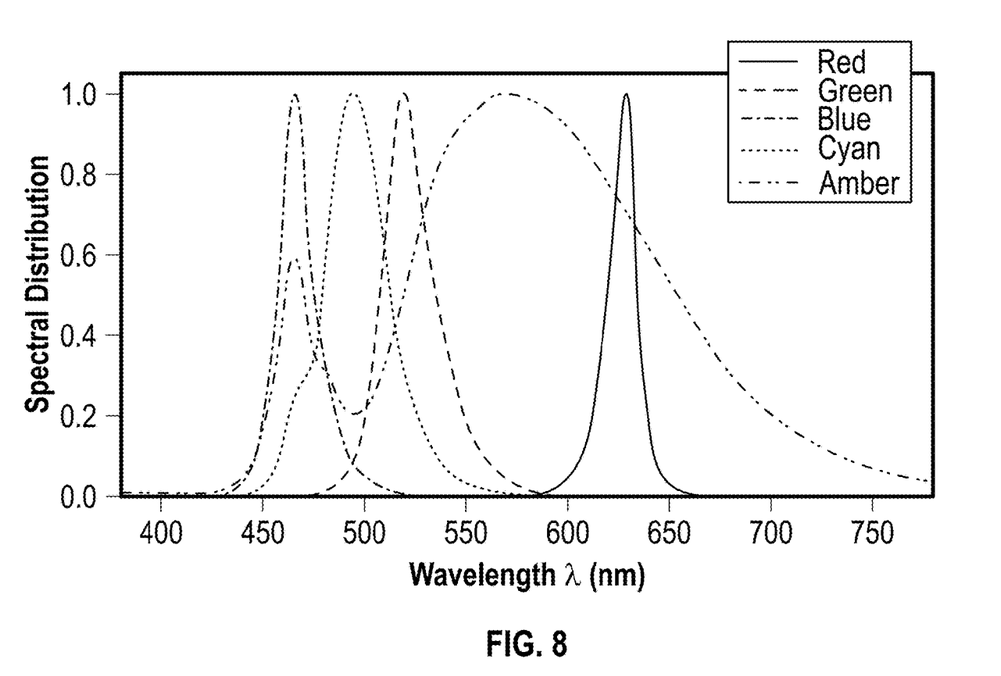
FIG. 8 is a graph of spectral power distributions normalized by peak energy for five LED subpixels in the RGBCA LED package of FIG. 1A.

FIG. 8 shows a graph of spectral power distributions normalized by peak energy for the five subpixels (i.e., red subpixel, green subpixel, blue subpixel, cyan subpixel, amber subpixel) in the RGBCA LED package 200. The red LED chip 210, green LED chip 220 and blue LED chip 230 (e.g., red subpixel, green subpixel, blue subpixel) can have narrow bandwidths and the cyan LED chip 240 and amber LED chip 250 (e.g., cyan subpixel, amber subpixel) can have wide bandwidths. As shown in FIG. 8, the bandwidth of the cyan LED chip 240 matches the gap between the bandwidth of the blue LED chip 230 and the green LED chip 220, and the bandwidth of the amber LED chip 250 matches the gap between the bandwidth of the red LED chip 210 and the green LED chip 220. Advantageously, this allows improved observer metamerism when viewing the display (e.g., LED video display 400), or increased alignment between different cameras or people viewing the same LED video display 400 (e.g., in direct view). Advantageously, this also provides a flat spectrum so that the LED video display 400 provides more natural lighting (e.g., lighting that is more circadian balanced). Therefore, the LED video display 400 (which can be driven by HDMI, DisplayPort, etc.) can provide both a video function and a lighting function. As for the lighting function, the LED video display 400 with the broad spectrum provides improved color quality. Another advantage of the LED video display 400 (with LED tiles with RGBCA modules 100), is that it has improved power efficiency. For example, the LED video display 400 can provide 30% more light with 50% less power as compared to similar LED video displays that only use RGB LED packages.

Figure 9:
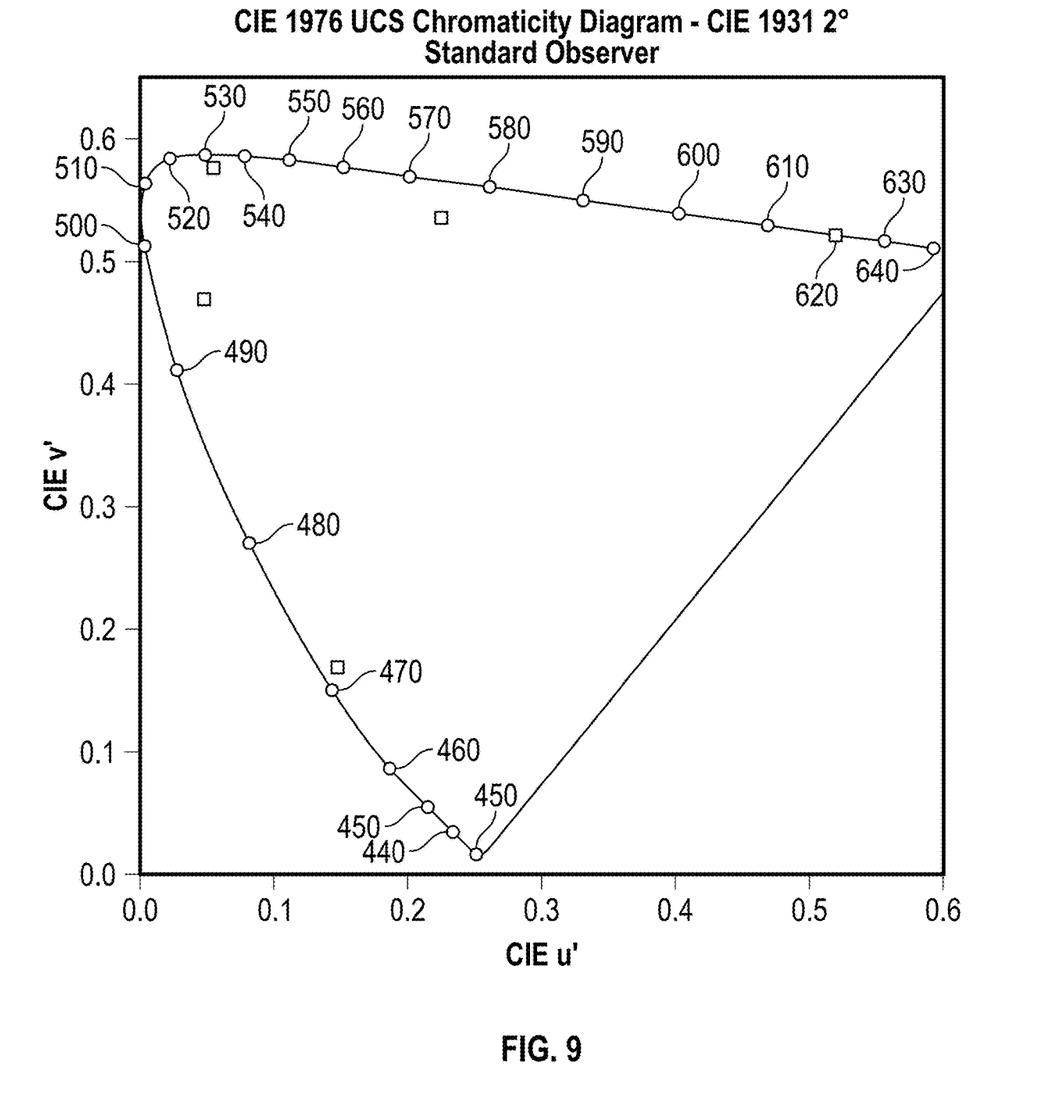
FIG. 9 is a Commission on Illumination (CIE) 1976 Chromaticity diagram showing the color locations of each of the five LED subpixels in the RGBCA LED package of FIG. 1A.

FIG. 9 shows a Commission on Illumination (CIE) 1976 Chromaticity diagram showing (as dots) the color locations of each of the five LED subpixels (e.g., red subpixel, green subpixel, blue subpixel, cyan subpixel and amber subpixel) in the RGBCA LED package of FIG. 1A.

Additional Examples

In examples of the present disclosure, an LED display module, LED display tile and LED video display may be in accordance with any of the following clauses:

Clause 1. A light emitting diode (LED) display module, comprising: a plurality of red, green, blue, cyan, amber (RGBCA) light emitting diode (LED) packages spaced apart from each other in an array of between 100×100 and 250×250 and mounted on a single printed circuit board; and electronics adapted to operate the plurality of RGBCA LED packages, wherein each RGBCA LED package is a pixel that is addressable individually by the electronics, each RGBCA LED package including a red LED chip, a blue LED chip, a green LED chip, a cyan LED chip and an amber LED chip, wherein the red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth.

Clause 2. The LED display module of Clause 1, wherein the red LED chip has a dominant wavelength of between 610 nm and 630 nm and an excitation purity of 90% or greater.

Clause 3. The LED module of any preceding clause, wherein the green LED chip has a dominant wavelength of between 510 nm and 540 nm and an excitation purity of 80% or greater.

Clause 4. The LED display module of any preceding clause, wherein the blue LED chip has a dominant wavelength of between 460 nm and 475 nm and an excitation purity of 60% or greater.

Clause 5. The LED display module of any preceding clause, wherein the cyan LED chip has a dominant wavelength of between 480 nm and 510 nm and an excitation purity of 60-90%.

Clause 6. The LED display module of any preceding clause, wherein the amber LED chip has a dominant wavelength of between 560 nm and 590 nm and an excitation purity of 60-90%.

Clause 7. The LED display tile of any preceding clause, wherein the RGBCA LED packages in each LED module are spaced apart from each other with a pitch of between 1 mm and 8 mm.

Clause 8. A light emitting diode (LED) display tile, comprising: a plurality of LED display modules, each LED display module comprising: a plurality of red, green, blue, cyan, amber (RGBCA) light emitting diode (LED) packages spaced apart from each other in an array of between 100×100 and 250×250 and mounted on a single printed circuit board, each RGBCA LED package being a pixel that is addressable individually, each RGBCA LED package including a red LED chip, a blue LED chip, a green LED chip, a cyan LED chip and an amber LED chip, wherein the red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth; a frame housing the plurality of LED display modules, the frame being coupleable to one or more other frames, each housing a plurality of LED display modules to define a continuous display; and electronics adapted to operate the plurality of RGBCA LED packages of the plurality of LED display modules housed in the frame.

Clause 9. The LED display tile of Clause 8, wherein the red LED chip has a dominant wavelength of between 610 nm and 630 nm and an excitation purity of 90% or greater.

Clause 10. The LED display tile of any of clauses 8-9, wherein the green LED chip has a dominant wavelength of between 510 nm and 535 nm and an excitation purity of 80% or greater.

Clause 11. The LED display tile of any of clauses 8-10, wherein the blue LED chip has a dominant wavelength of between 460 nm and 475 nm and an excitation purity of 70% or greater.

Clause 12. The LED display tile of any of clauses 8-11, wherein the cyan LED chip has a dominant wavelength of between 480 nm and 510 nm and an excitation purity of 60-90%.

Clause 13. The LED display tile of any of clauses 8-12, wherein the amber LED chip has a dominant wavelength of between 560 nm and 590 nm and an excitation purity of 60-90%.

Clause 14. The LED display tile of any of clauses 8-13, wherein the RGBCA LED packages in each LED module are spaced apart from each other with a pitch of between 1 mm and 8 mm.

Clause 15. The LED display tile of any of clauses 8-14, wherein each LED display module has a square or rectangular form factor.

Clause 16. A light emitting diode (LED) video display, comprising: a plurality of LED display tiles coupled together side by side to define a continuous display, each of the plurality of LED display tiles comprising a plurality of LED display modules, each LED display module comprising: a plurality of red, green, blue, cyan, amber (RGBCA) light emitting diode (LED) packages spaced apart from each other in an array of between 100×100 and 250×250 and mounted on a single printed circuit board, each RGBCA LED package being a pixel that is addressable individually, each RGBCA LED package including a red LED chip, a blue LED chip, a green LED chip, a cyan LED chip and an amber LED chip, wherein the red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth; a frame housing the plurality of LED display modules, the frame being coupleable to one or more other frames, each housing a plurality of LED display modules to define a continuous display; and electronics adapted to operate the plurality of RGBCA LED packages of the plurality of LED modules housed in the frame.

Clause 17. The LED video display of Clause 16, wherein the red LED chip has a dominant wavelength of between 610 nm and 630 nm and an excitation purity of 90% or greater.

Clause 18. The LED video display of any of clauses 16-17, wherein the green LED chip has a dominant wavelength of between 510 nm and 540 nm and an excitation purity of 80% or greater.

Clause 19. The LED video display of any of clauses 16-18, wherein the blue LED chip has a dominant wavelength of between 460 nm and 475 nm and an excitation purity of 60% or greater.

Clause 20. The LED video display of any of clauses 16-19, wherein the cyan LED chip has a dominant wavelength of between 480 nm and 510 nm and an excitation purity of 60-90%.

Clause 21. The LED video display of any of clauses 16-20, wherein the amber LED chip has a dominant wavelength of between 560 nm and 590 nm and an excitation purity of 60-90%.

Clause 22. The LED video display of any of clauses 16-21, wherein the RGBCA LED packages in each LED module are spaced apart from each other with a pitch of between 1 mm and 8 mm.

Clause 23. The LED video display of any of clauses 16-22, wherein each LED display module has a square or rectangular form factor.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of the stated amount. As another example, in certain embodiments, the terms "generally parallel" and "substantially parallel" refer to a value, amount, or characteristic that departs from exactly parallel by less than or equal to 10 degrees.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A light emitting diode (LED) display module, comprising:
   a plurality of red, green, blue, cyan, amber (RGBCA) light emitting diode (LED) packages spaced apart from each other in an array of between 100×100 and 250×250 and mounted on a single printed circuit board; and
   electronics adapted to operate the plurality of RGBCA LED packages,
   wherein each RGBCA LED package is a pixel that is addressable individually by the electronics, each RGBCA LED package including a red LED chip, a blue LED chip, a green LED chip, a cyan LED chip and an amber LED chip,
   wherein the red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth.

2. The LED display module of claim 1, wherein the red LED chip has a dominant wavelength of between 610 nm and 630 nm and an excitation purity of 90% or greater.

3. The LED display module of claim 1, wherein the green LED chip has a dominant wavelength of between 510 nm and 540 nm and an excitation purity of 80% or greater.

4. The LED display module of claim 1, wherein the blue LED chip has a dominant wavelength of between 460 nm and 475 nm and an excitation purity of 60% or greater.

5. The LED display module of claim 1, wherein the cyan LED chip has a dominant wavelength of between 480 nm and 510 nm and an excitation purity of 60-90%.

6. The LED display module of claim 1, wherein the amber LED chip has a dominant wavelength of between 560 nm and 590 nm and an excitation purity of 60-90%.

7. The LED display module of claim 1, wherein the RGBCA LED packages in each LED module are spaced apart from each other with a pitch of between 1 mm and 8 mm.

8. A light emitting diode (LED) display tile, comprising:
   a plurality of LED display modules, each LED display module comprising:
      a plurality of red, green, blue, cyan, amber (RGBCA) light emitting diode (LED) packages spaced apart from each other in an array of between 100×100 and 250×250 and mounted on a single printed circuit board, each RGBCA LED package being a pixel that is addressable individually, each RGBCA LED package including a red LED chip, a blue LED chip, a green LED chip, a cyan LED chip and an amber LED chip, wherein the red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth;
   a frame housing the plurality of LED display modules, the frame being coupleable to one or more other frames, each housing a plurality of LED display modules to define a continuous display; and
   electronics adapted to operate the plurality of RGBCA LED packages of the plurality of LED display modules housed in the frame.

9. The LED display tile of claim 8, wherein the red LED chip has a dominant wavelength of between 610 nm and 630 nm and an excitation purity of 90% or greater.

10. The LED display tile of claim 8, wherein the green LED chip has a dominant wavelength of between 510 nm and 535 nm and an excitation purity of 80% or greater.

11. The LED display tile of claim 8, wherein the blue LED chip has a dominant wavelength of between 460 nm and 475 nm and an excitation purity of 70% or greater.

12. The LED display tile of claim 8, wherein the cyan LED chip has a dominant wavelength of between 480 nm and 510 nm and an excitation purity of 60-90%.

13. The LED display tile of claim 8, wherein the amber LED chip has a dominant wavelength of between 560 nm and 590 nm and an excitation purity of 60-90%.

14. The LED display tile of claim 8, wherein the RGBCA LED packages in each LED module are spaced apart from each other with a pitch of between 1 mm and 8 mm.

15. The LED display tile of claim 8, wherein each LED display module has a square or rectangular form factor.

16. A light emitting diode (LED) video display, comprising:
   a plurality of LED display tiles coupled together side by side to define a continuous display, each of the plurality of LED display tiles comprising a plurality of LED display modules, each LED display module comprising:
      a plurality of red, green, blue, cyan, amber (RGBCA) light emitting diode (LED) packages spaced apart from each other in an array of between 100×100 and 250×250 and mounted on a single printed circuit board, each RGBCA LED package being a pixel that is addressable individually, each RGBCA LED package including a red LED chip, a blue LED chip, a green LED chip, a cyan LED chip and an amber LED chip, wherein the red LED chip, the blue LED chip and the green LED chip operate at a narrow bandwidth, and the cyan LED chip and amber LED chip operate at a wide bandwidth, the cyan LED chip bandwidth being between the blue LED chip bandwidth and the green LED chip bandwidth, and the amber LED chip bandwidth being between the red LED chip bandwidth and the green LED chip bandwidth;

a frame housing the plurality of LED display modules, the frame being coupleable to one or more other frames, each housing a plurality of LED display modules to define a continuous display; and electronics adapted to operate the plurality of RGBCA LED packages of the plurality of LED modules housed in the frame.

17. The LED video display of claim 16, wherein the red LED chip has a dominant wavelength of between 610 nm and 630 nm and an excitation purity of 90% or greater.

18. The LED video display of claim 16, wherein the green LED chip has a dominant wavelength of between 510 nm and 540 nm and an excitation purity of 80% or greater.

19. The LED video display of claim 16, wherein the blue LED chip has a dominant wavelength of between 460 nm and 475 nm and an excitation purity of 60% or greater.

20. The LED video display of claim 16, wherein the cyan LED chip has a dominant wavelength of between 480 nm and 510 nm and an excitation purity of 60-90%.

21. The LED video display of claim 16, wherein the amber LED chip has a dominant wavelength of between 560 nm and 590 nm and an excitation purity of 60-90%.

22. The LED video display of claim 16, wherein the RGBCA LED packages in each LED module are spaced apart from each other with a pitch of between 1 mm and 8 mm.

23. The LED video display of claim 16, wherein each LED display module has a square or rectangular form factor.

* * * * *